United States Patent
Kishii et al.

(10) Patent No.: US 8,399,295 B2
(45) Date of Patent: Mar. 19, 2013

(54) SEMICONDUCTOR DEVICE AND ITS MANUFACTURE METHOD

(75) Inventors: Sadahiro Kishii, Kawasaki (JP); Tsuyoshi Kanki, Kawasaki (JP); Yoshihiro Nakata, Kawasaki (JP); Yasushi Kobayashi, Kawasaki (JP); Masato Tanaka, Nagano (JP); Akio Rokugawa, Nagano (JP)

(73) Assignees: Fujitsu Limited, Kawasaki (JP); Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 13/019,509

(22) Filed: Feb. 2, 2011

(65) Prior Publication Data

US 2011/0187002 A1    Aug. 4, 2011

(30) Foreign Application Priority Data

Feb. 4, 2010    (JP) ................. 2010-023043

(51) Int. Cl.
*H01L 23/28*        (2006.01)
*H01L 21/56*        (2006.01)

(52) U.S. Cl. ............. 438/107; 257/E21.502; 438/106; 438/110; 438/113; 438/125; 438/126; 438/127; 438/613

(58) Field of Classification Search ........... 257/E21.502; 438/106, 107, 110, 113, 125, 126, 127, 613
See application file for complete search history.

(56) References Cited

U.S. PATENT DOCUMENTS

| 7,135,378 | B2 | 11/2006 | Takaoka |
| 2002/0004257 | A1 | 1/2002 | Takaoka |
| 2004/0113245 | A1 | 6/2004 | Takaoka |
| 2007/0126127 | A1* | 6/2007 | Jobetto et al. ............. 257/780 |

FOREIGN PATENT DOCUMENTS

JP    2001-274315 A1    10/2001

* cited by examiner

*Primary Examiner* — Peniel M Gumedzoe

(74) *Attorney, Agent, or Firm* — Kratz, Quintos & Hanson, LLP

(57) ABSTRACT

A support substrate includes a first surface and a second surface located above the level of the first surface. Chips are mounted on the first surface. A first insulating film is disposed over each chip. First conductive plugs are connected to the chip extending through each first insulating film. Filler material made of resin filling a space between chips. Wirings are disposed over the first insulating film and the filler material for interconnecting different chips. The second surface, an upper surface of the first insulating film and an upper surface of the filler material are located at the same level.

9 Claims, 14 Drawing Sheets

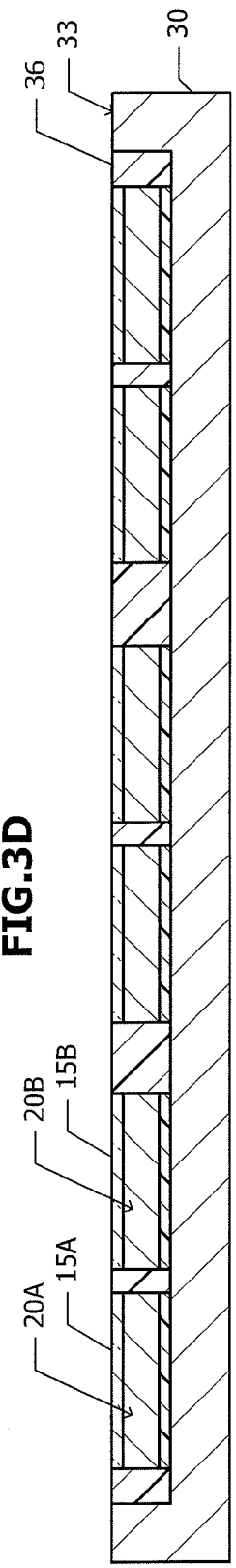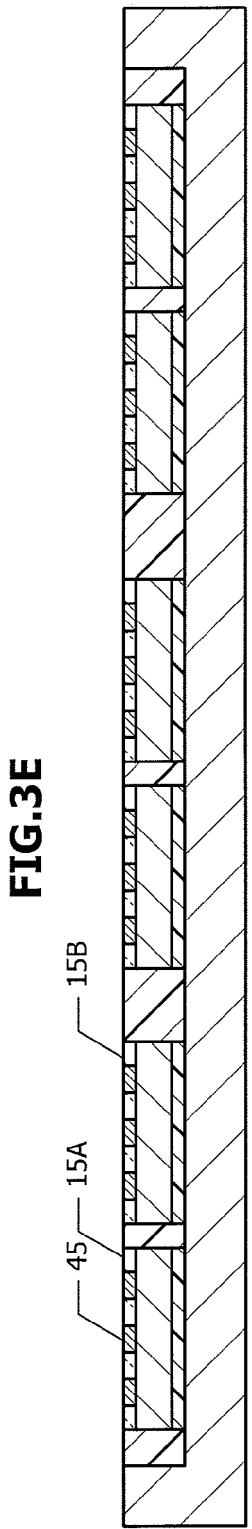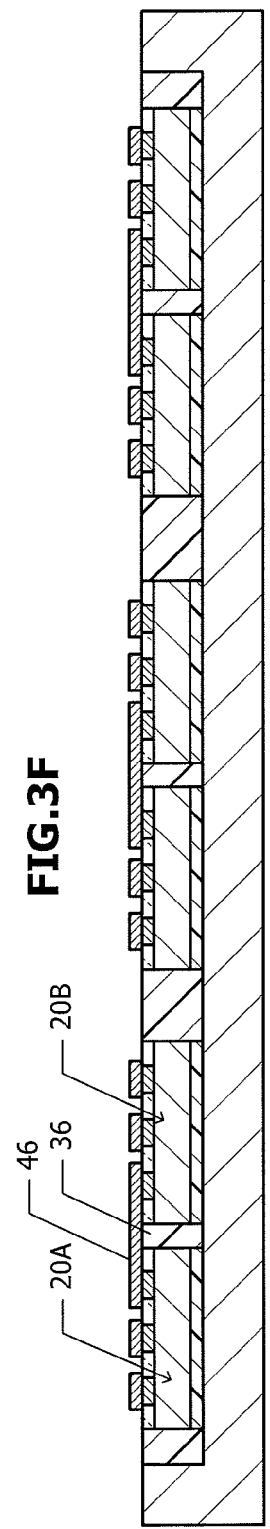

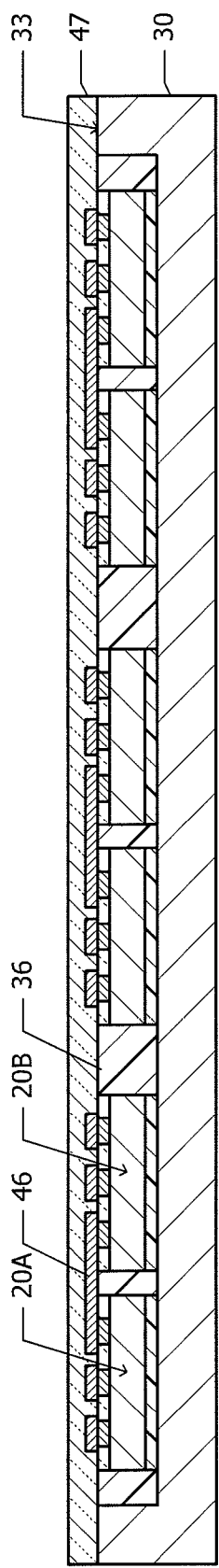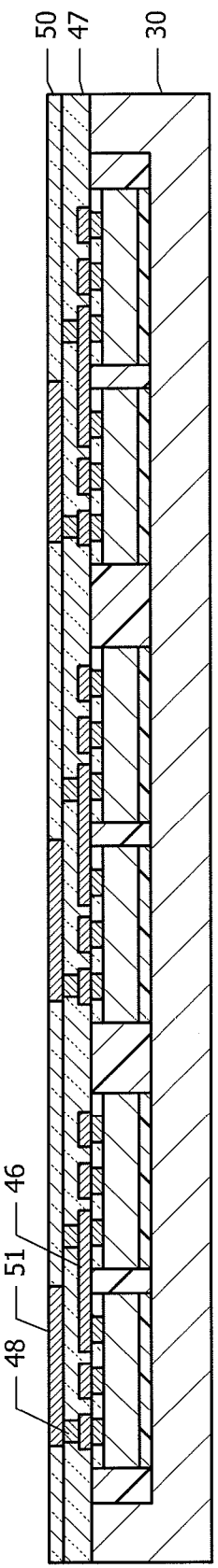

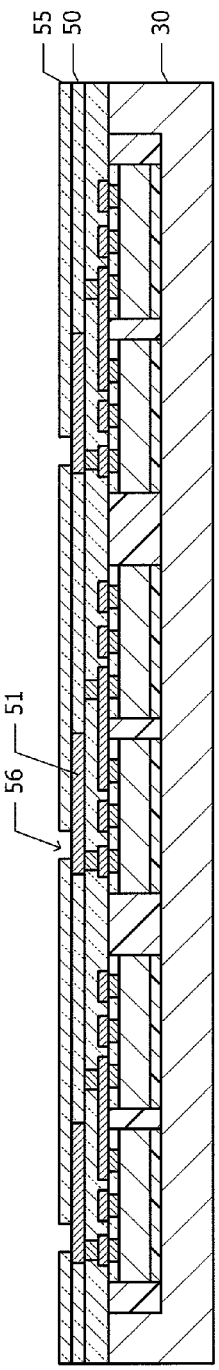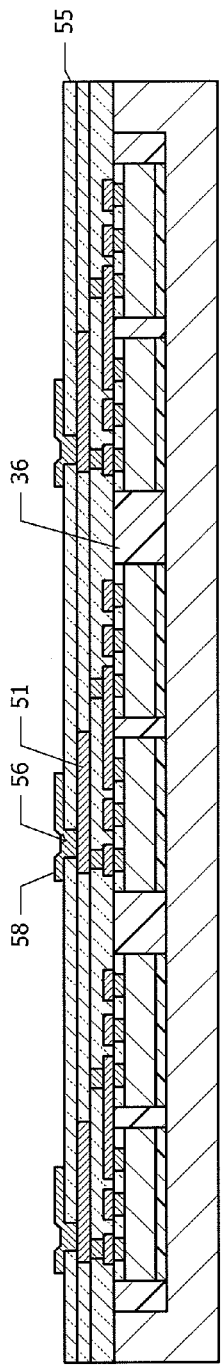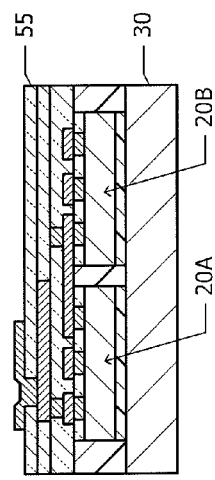

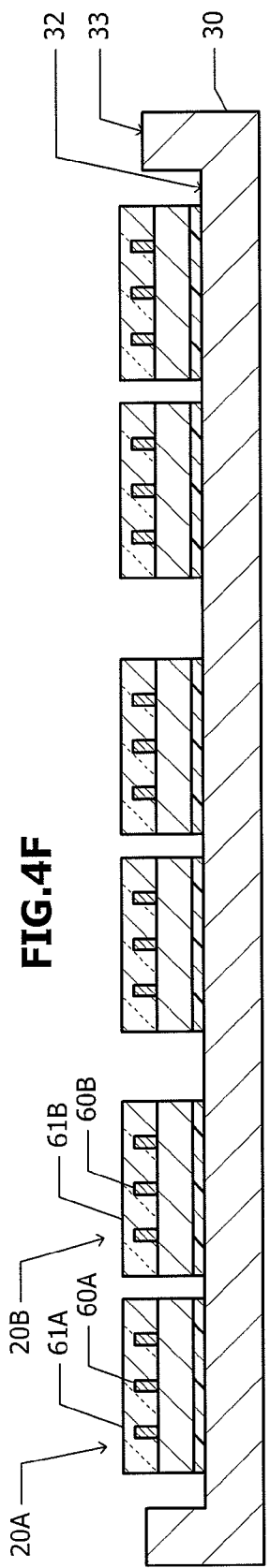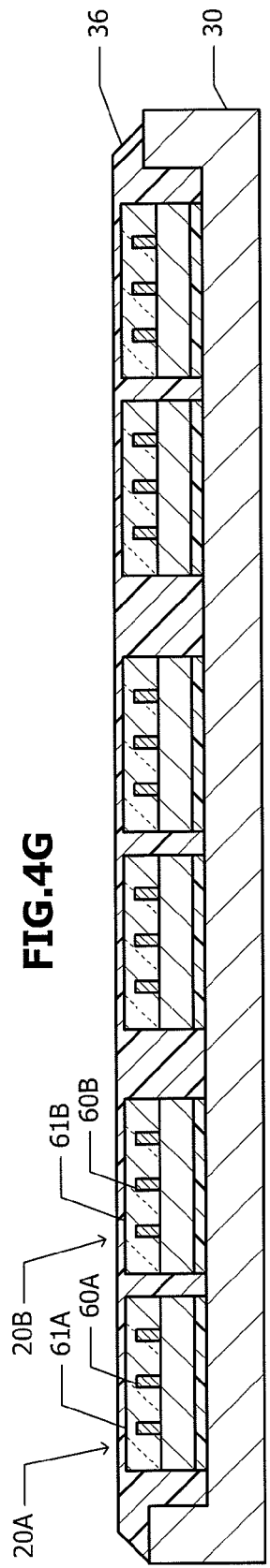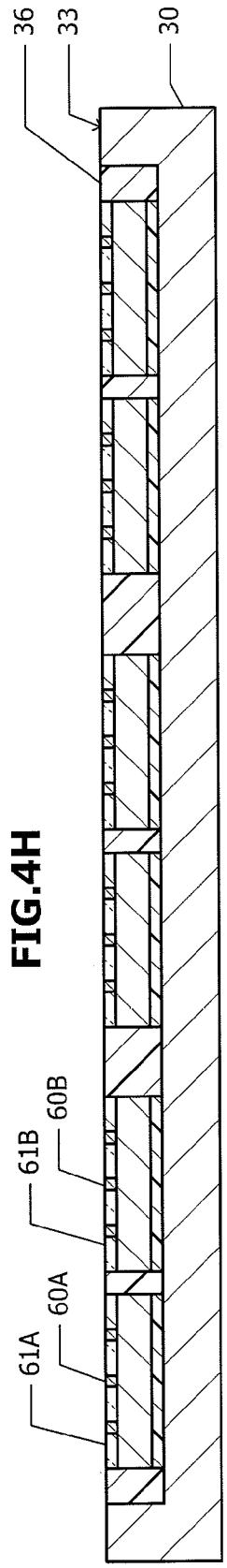

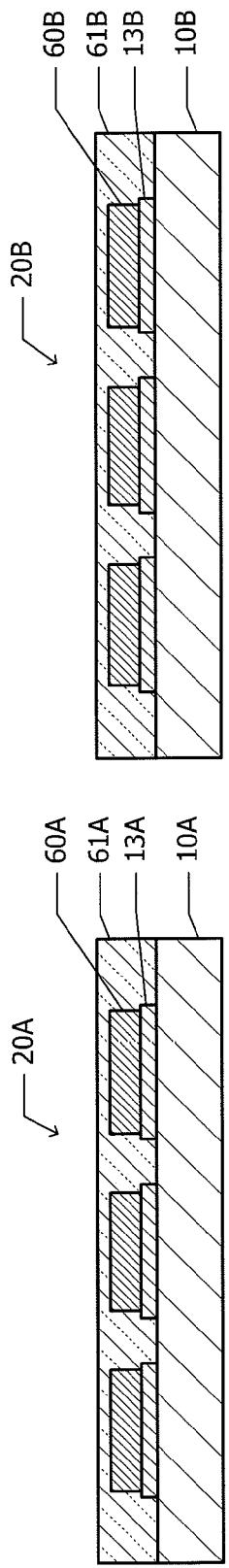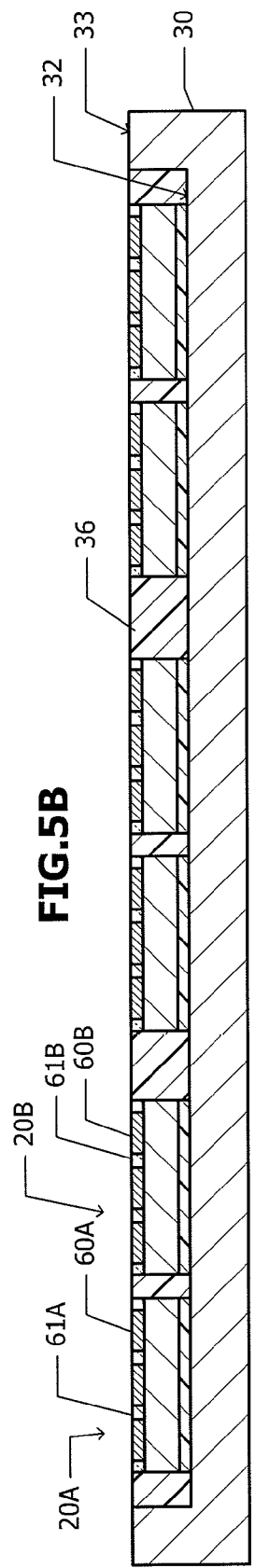

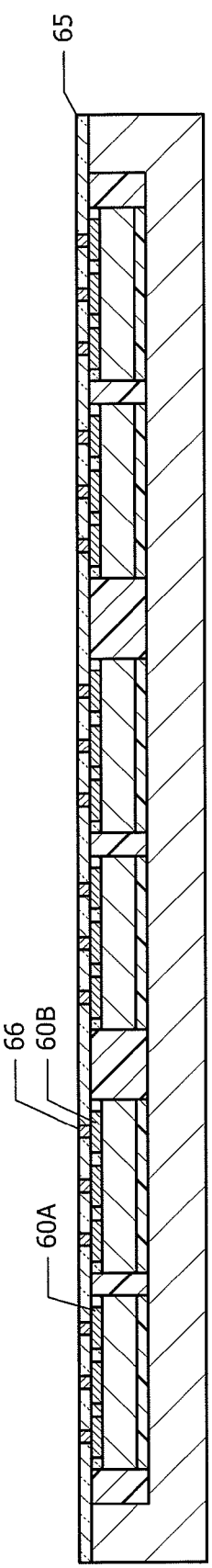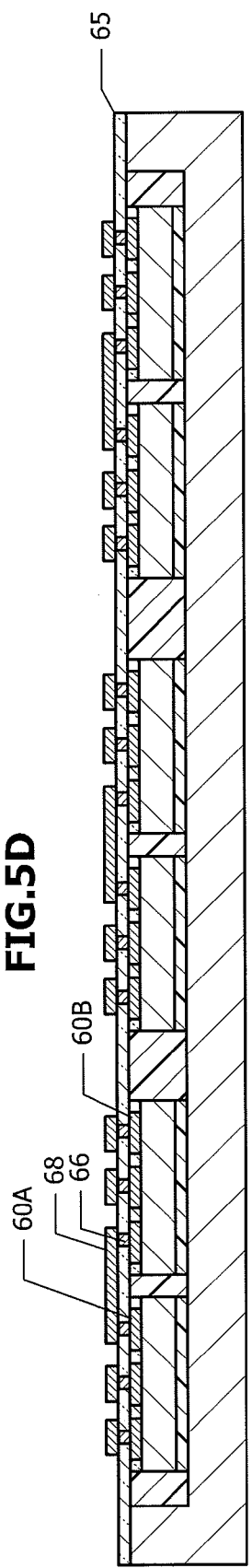
FIG.5C
FIG.5D

SEMICONDUCTOR DEVICE AND ITS MANUFACTURE METHOD

CROSS-REFERENCE TO RELATED APPLICATION

This application is based upon and claims the benefit of priority of the prior Japanese Patent Application No. 2010-023043, filed on Feb. 4, 2010, the entire contents of which are incorporated herein by reference.

FIELD

The embodiments discussed herein are related to a semiconductor device and its manufacture method in which multi-chip module (MCM) technology is applied. In the MCM technology, semiconductor chips are mounted on a common substrate and interconnected by wirings.

BACKGROUND

Description will be made on an example of a conventional MCM manufacture method. A plurality of semiconductor chips are die-bonded onto a support substrate. The plurality of semiconductor chips are embedded in an insulating film formed by chemical vapor deposition (CVD). Chemical mechanical polishing (CMP) is performed for the insulating film to planarize the surface thereof.

Contact holes and wiring trenches are formed on the planarized insulating film, and filled with a conductive material to form wirings interconnecting the semiconductor chips. This wiring forming process is repeated to form a plurality of wiring layers. Pads are formed on the uppermost wiring layer, and projected electrodes (bumps) are formed on the pads.
[Patent Document]
Japanese Laid-open Patent Publication No. 2001-274315

SUMMARY

Thicknesses of a plurality of semiconductor chips mounted on the same support substrate are not always the same. If there is a variation in thicknesses of the semiconductor chips, an exposure precision may be reduced during forming contact holes and wiring trenches. If an insulating film burying the semiconductor chips is to be formed by CVD, a film forming time prolongs and this is not suitable for mass production. A relatively thick semiconductor chip may be exposed after CMP due to an in-plane variation in polishing rate during CMP or a deviation of a polished thickness from a target value.

According to an aspect of the invention, a semiconductor device includes:
a support substrate including a first surface and a second surface located above a level of the first surface;
chips mounted over the first surface;
first insulating films, each of which is disposed over each of the chips;
first conductive plugs formed through each of the first insulating films and connected to each of the chips;
filler material made of resin and filling a space between the chips; and
wirings disposed over the first insulating films and the filler material, wherein the second surface, upper surfaces of the first insulating films, and an upper surface of the filler material are located at a same level.

According to another aspect of the invention, a semiconductor device manufacture method includes:
mounting chips over a first surface of a support substrate, each of the chips having pads and a first insulating film covering the pads, the support substrate having a second surface located above a level of the first surface;
filling a filler material in a space between the chips and covering the chips and the second surface with the filler material;
grinding the filler material until the second surface and the first insulating film are exposed; and
after the filler material is ground, forming wirings over the filler material and the first insulating film, the wirings connecting a pad of one of the chips to a pad of another chip.

According to still another aspect of the invention, a semiconductor device includes:
a support substrate;
chips mounted on the support substrate and having pads formed over an upper surface thereof;
first insulating films, each of which is formed over each of the chips;
first conductive plugs connected to the pads and disposed in the first insulating films;
filler material made of resin filling a space between the chips and defining a flat surface together with an upper surface of the first insulating film;
a second insulating film disposed over the first insulating film and the filler material;
second conductive plugs disposed in the second insulating film and connected to the first conductive plugs, the second conductive plugs being smaller in horizontal cross-sectional area than the first conductive plugs; and
wirings formed over the second insulating film and interconnecting pads of different chips via the second conductive plug and the first conductive plug.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A to 3J are cross sectional views illustrating a semiconductor device during manufacture of the semiconductor device manufacture method according to the first embodiment, and FIG. 3K is a cross sectional view illustrating a manufactured multi-chip module.

FIGS. 4F to 4H are cross sectional views illustrating a semiconductor device during manufacture of the semiconductor device manufacture method according to the second embodiment.

FIG. 5A is a cross sectional view illustrating a semiconductor chip manufactured by the semiconductor device manufacture method according to the third embodiment, and FIGS. 5B to 5D are cross sectional views illustrating a semiconductor device during manufacture.

DESCRIPTION OF EMBODIMENTS

First Embodiment

Description will be made on a semiconductor device manufacture method of the first embodiment with reference to FIGS. 1A to 3K.

Figure 1A:
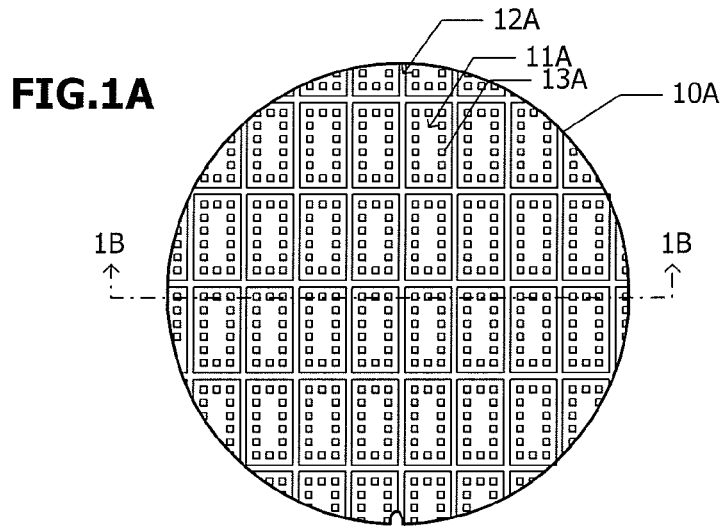
FIG. 1A is a plane view illustrating a wafer during manufacture of a semiconductor device manufacture method according to a first embodiment.
Figure 1B:
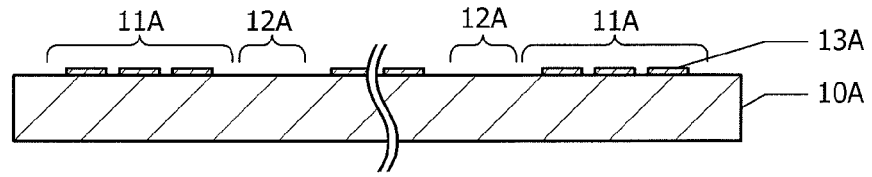
FIGS. 1B to 1D are cross sectional views illustrating the wafer during manufacture.

FIG. 1A is a plane view illustrating a wafer 10A. FIG. 1B is a cross sectional view taken along lone-dot chain line 1B-1B in FIG. 1A. A plurality of chip areas 11A are defined by lattice streets 12A on the surface of the wafer 10A. A plurality of pads 13A are formed on the surface of each chip area 11A. A thickness of the wafer 10A is about 725 micrometers.

Figure 1C:
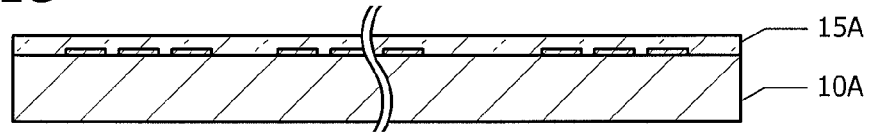

As illustrated in FIG. 1C, an insulating film 15A is formed on the wafer 10A. The insulating film 15A may be made of silicon oxide, silicon nitride and so on. A thickness of the insulating film 15A is, for example, 15 micrometers. The insulating film 15A may be formed, for example, by CVD. Insulating resin such as epoxy resin may be used for the insulating film 15A.

Figure 1D:
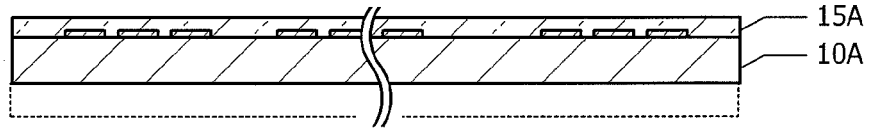

As illustrated in FIG. 1D, the bottom surface of the wafer 10A is ground to thin the wafer 10A to 250 micrometers. A thickness of the wafer 10A may be made thinner than 250 micrometers so long as a sufficient mechanical strength is maintained.

Figure 1E:
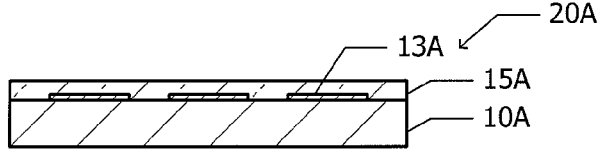
FIGS. 1E and 1F are cross sectional views of a semiconductor chip after dividing the wafer.

As illustrated in FIG. 1E, the wafer 10A is divided to obtain semiconductor chips 20A. The semiconductor chip 20A includes a divided wafer (substrate) 10A, pads 13A and a divided insulating film 15A. Each semiconductor chip 20A is rectangle having a short side of 5 mm and a longer side of 10 mm. Each pad 13A is a square having a side of 50 micrometers to 100 micrometers.

Figure 1F:
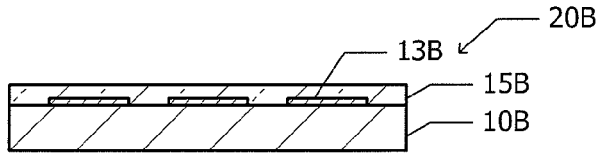

As illustrated in FIG. 1F, a semiconductor chip 20B divided from another wafer and formed with a different circuit is prepared. The semiconductor chip 20B includes a substrate 10B, pads 13B and an insulating film 15B. When each wafer is ground in the process illustrated in FIG. 1D, a thickness of a left wafer is controlled so that thicknesses of the semiconductor chip 20A and 20B are able to be set in the range of 250 micrometers±1 micrometer.

Thicknesses of semiconductor chips are not controlled strictly, and vary in a range of about ±30 micrometers. It was confirmed that a variation in a thickness of a semiconductor chips 20A and 20B is able to be set in a range of ±1 micrometer by grinding with grate accuracy the bottom surface of the semiconductor chips 20A and 20B before division from wafers.

Figure 2A:
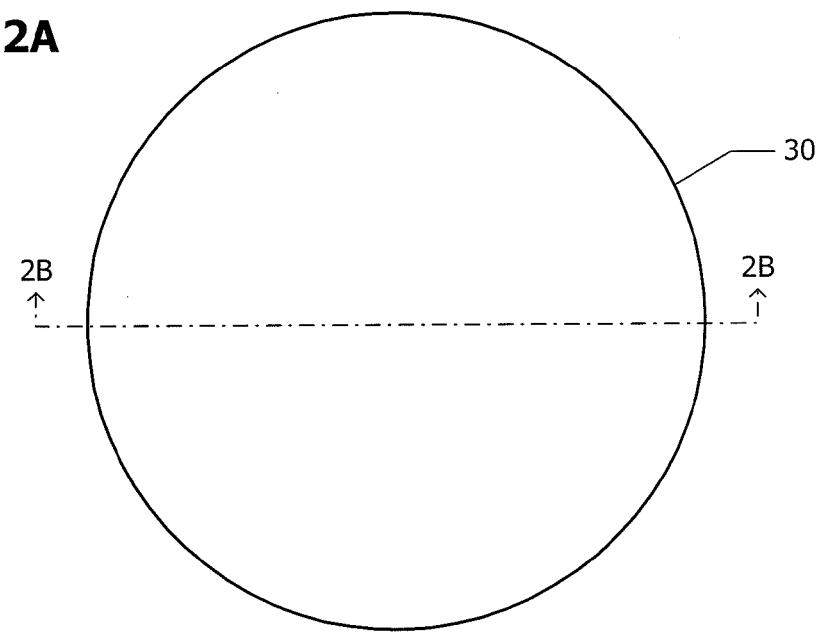
FIGS. 2A and 2B are a plane view and a cross sectional view illustrating a support substrate to be used in the semiconductor manufacture method of the first embodiment before a recess of the support substrate is formed.
Figure 2B:

As illustrated in FIG. 2A, a circular support substrate 30 is prepared. For example, a silicon wafer is used for the support substrate 30. A glass substrate or a ceramic substrate may be used for the support substrate 30. FIG. 2B is a cross sectional view taken along one-dot chain line 2B-2B in FIG. 2A, and shows that the upper surface of the blank support substrate 30 prior to grinding is flat. A thickness of the support substrate 30 is, for example, 750 micrometers.

Figure 2C:
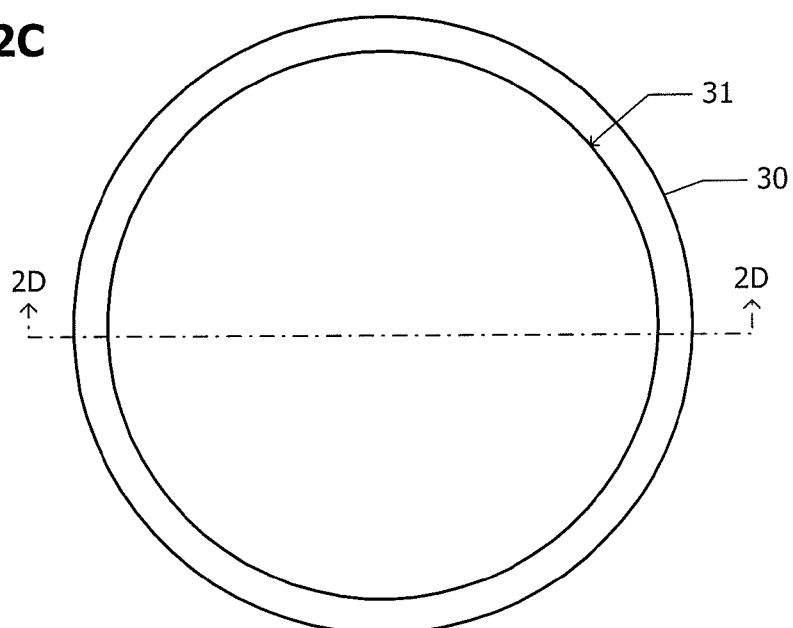
FIGS. 2C and 2D are a plane view and a cross sectional view illustrating a support substrate after the recess is formed.
Figure 2D:
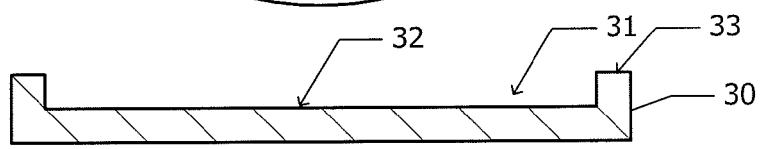

As illustrated in FIG. 2C, a recess 31 is formed in the support substrate 30. FIG. 2D is a cross sectional view taken along one dot-chain line 2D-2D in FIG. 2C. A plane shape of the recess 31 is a circle smaller than the support substrate 30. The bottom surface of the recess 31 is flat. The recess 31 may be formed by a grinder. A support substrate 30 having a relatively lower surface (bottom surface of the recess 31) 32 and a relatively higher surface 33 on the same side is therefore obtained. A depth of the recess 31 is set to a proper value depending upon thicknesses of semiconductor chips to be mounted. From the viewpoint of a mechanical strength of the support substrate 30, grinding feasibility and the like, it is preferable to set a depth of the recess 31 in a range of 50 micrometers to 400 micrometers. Description will be made later on the relation between a thickness of a semiconductor chip to be mounted and a preferable depth of the recess 31.

Figure 3A:
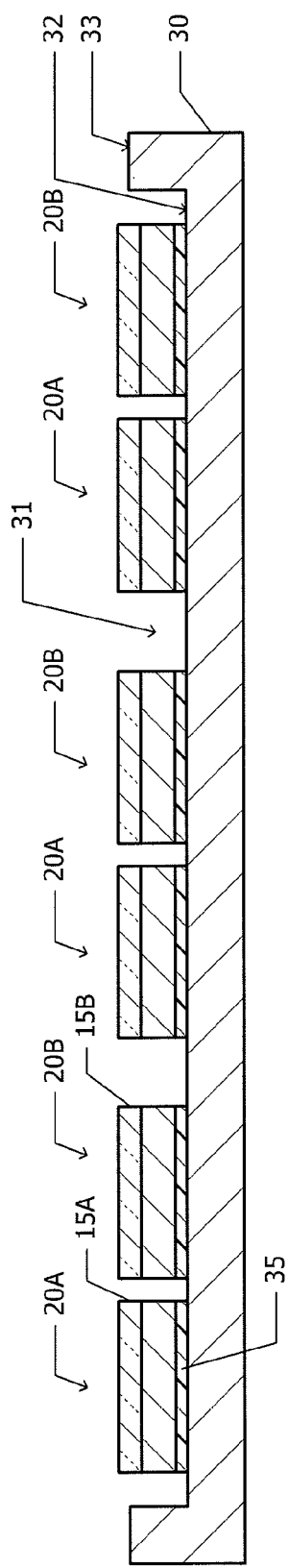

As illustrated in FIG. 3A, a plurality of sets, each of which consists of a semiconductor chip 20A and a semiconductor chip 20B, are mounted on the lower surface 32 of the support substrate 30. In FIG. 3A, pads 13A and 13B (FIGS. 1E and 1F) of the semiconductor chips 20A and 20B are not traced. The semiconductor chips 20A and 20B are fixed to the support substrate 30 with adhesive 35. The adhesive 35 may be made of resin containing epoxy resin, phenol resin, benzocyclobutene (BCB) or the like. A thickness of the adhesive 35 after fixation is, for example, about 10 micrometers. For example, the semiconductor chip 20A is a logic circuit device and the other semiconductor chip 20B is a memory circuit device. A distance between the semiconductor chip 20A and the semiconductor chip 20B corresponding to each other is, for example, 1 mm.

A depth of the recess 31 is adjusted in such a manner that a height of the higher surface 33 of the support substrate 30 is higher than bottom surfaces of the insulating films 15A, 15B in the state that the semiconductor chips 20A and 20B are fixed to the support substrate 30. Grinding stops between the bottom surface and upper surface of the insulating films 15A and 15B. The semiconductor chips 20A and 20B have approximately the same thickness through grinding illustrated in FIG. 1D. It is therefore possible to set a difference between upper surfaces of the semiconductor chips 20A and 20B equal to or less than 2 micrometers.

Figure 3B:
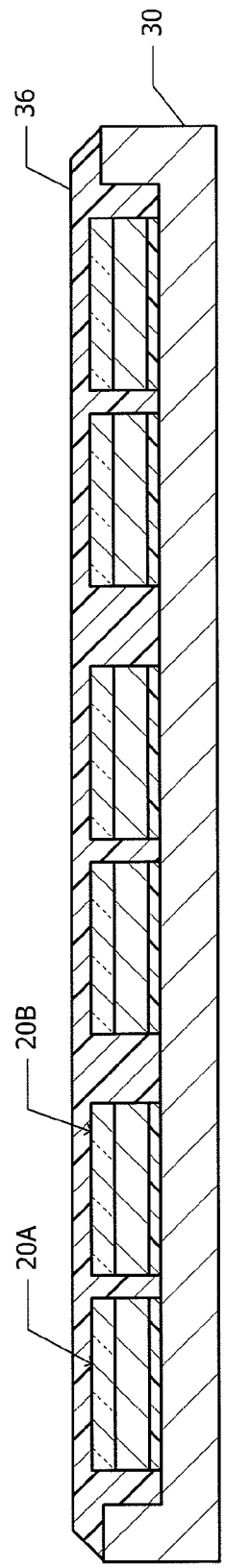

As illustrated in FIG. 3B, a filler material 36 is deposited on the support substrate 30. The filler material 36 covers the semiconductor chips 20A and 20B and fills a space therebetween. The filler material 36 may be insulating resin such as epoxy resin or the like. In depositing the filler material 36, a compression molding applied to general resin seal of a semiconductor chip may be used.

Since resin is used as the filler material 36, it is possible to shorten a time for forming the filler material 36 as compared to deposition of an inorganic insulating material by CVD or the like. Since the semiconductor chips 20A and 20B are thinned before mounting, the filler material 36 is able to be made thinner. It is therefore possible to reduce warp to be caused by different thermal expansion coefficients of the resin filler material 36 and the support substrate 30.

Figure 3C:
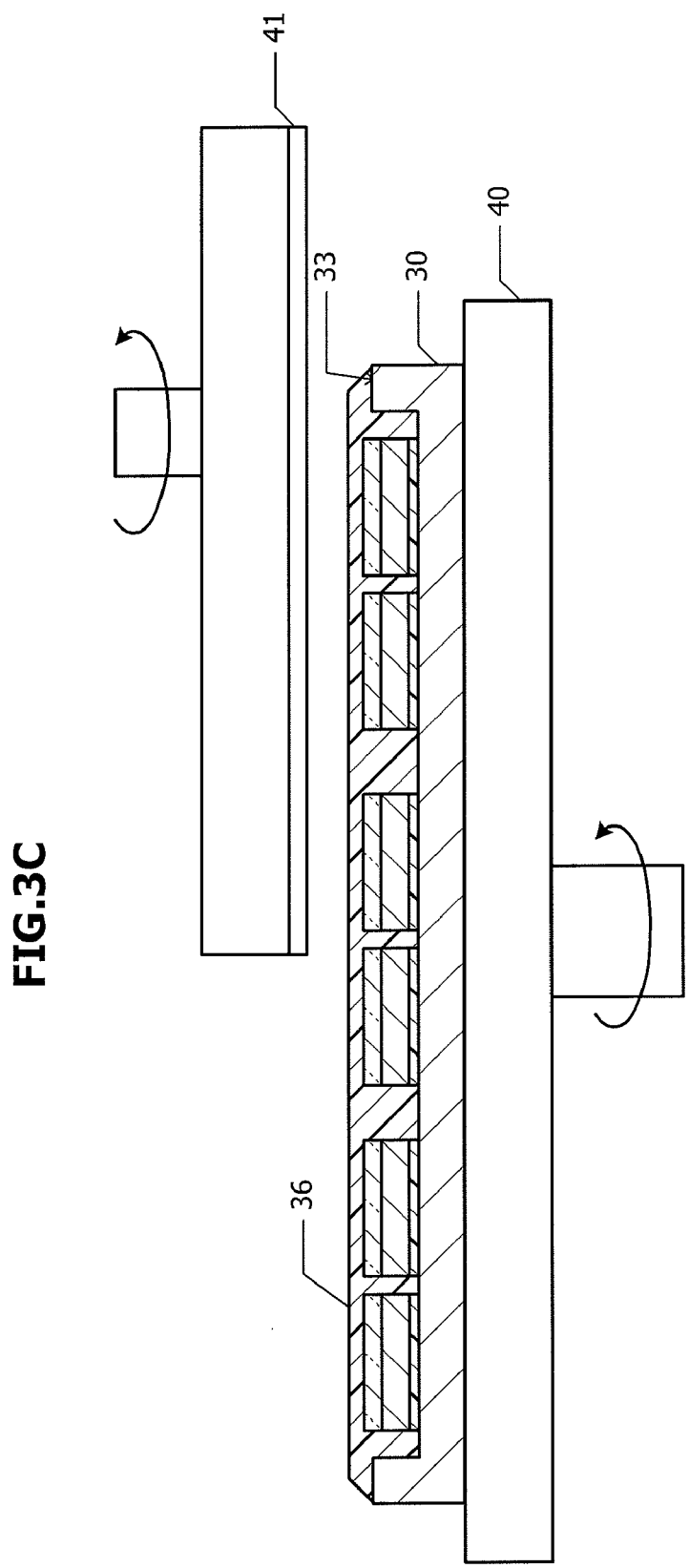

As illustrated in FIG. 3C, a support substrate 30 is placed on a rotary platen 40 of a grinder. The surface portion of the filler material 36 is ground with a rotary grinding stone 41. Grinding is stopped when the support substrate 30 is ground equal to or more than 10 micrometers from the higher surface 33 of the support substrate 30. If the support substrate 30 is ground by 100 micrometers, a high working accuracy by grinding is easy to be attained. Since the support substrate 30 is harder than the filler material 36, it is possible to grind at high accuracy with reference to the level of the higher surface 33 of the support substrate 30. For example, if the higher surface 33 as a height reference after grinding is not provided, it is difficult to set precision of a surface height after grinding equal to or less than ±5 micrometers. In the first embodiment, precision of the surface height after grinding was able to be set equal to or less than ±1 micrometer.

The higher surface 33 is disposed along an outer circumference of the support substrate 30 and surrounds the lower surface 32. It is therefore possible to make small an in-plane variation in surface height after grinding. If the higher surface 33 is not disposed, it is difficult to set an in-plane variation in surface height after grinding equal to or less than ±5 micrometers. In the first embodiment method, it was possible to set an in-plane variation in surface height after grinding was able to be set equal to or less than ±1 micrometer.

As compared to polishing the filler material 36 with alumina abrasive grains, in the first embodiment method, the surface of the filler material 36 is able to be planarized in shorter time.

FIG. 3D illustrates a support substrate 30, semiconductor chips 20A and 20B, and a filler material 36 after grinding. The upper surfaces of the filler material 36 and semiconductor chips 20A and 20B, and the higher surface 33 of the support substrate 30 are flush with each other (almost same level), and a flat surface is obtained. The upper portions of the insulating films 15A and 15B of the semiconductor chips 20A and 20B are also ground and the insulating films 15A and 15B are thinned. Levels of the upper surfaces of the semiconductor chips 20A and 20B before grinding close to each other, a surface height precision after grinding is high, and an in-plane variation is small. It is therefore possible to prevent the pads 13A and 13B (refer to FIGS. 1E and 1F) of the semiconductor chips 20A and 20B from being exposed.

As illustrated in FIG. 3E, conductive plugs 45 including a barrier metal film and a copper film are formed in the insulating films 15A and 15B. The conductive plugs 45 are connected to the pads 13A and 13B (refer to FIGS. 1E and 1F) of the semiconductor chips 20A and 20B. For example, a single damascene method may be used for forming the conductive plugs 45. In an exposure process of the single damascene method, exposure is performed by using a pair of semiconductor chips 20A and 20B as one exposure unit.

As illustrated in FIG. 3F, wirings 46 are formed on the filler material 36 covering the semiconductor chips 20A and 20B and embedding the spaces therebetween. For example, copper is used for the wirings 46. The wirings 46 electrically connect the semiconductor chip 20A to the corresponding semiconductor chip 20B. A semi-additive method may be used for forming the wirings 46. Description will be made on a sequence of forming the wirings 46 by the semi-additive method.

A copper seed layer is formed on the underlying surface by sputtering or the like. A resist film is formed on the seed layer, and openings corresponding to the wirings 46 are formed in the resist film. The resist film is thicker than the wirings 46 to be formed. Copper is plated on the seed layer exposed on the bottoms of the openings to form the wirings 46. After copper is plated, the resist film is removed, and then the seed layer where the wirings 46 are not formed is removed.

As illustrated in FIG. 3G, an interlayer insulating film 47 is deposited on the wirings 46, semiconductor chips 20A and 20B, filler material 36 and higher surface 33. After the interlayer insulating film 47 is deposited, the surface thereof is planarized. For example, silicon oxide is used for the interlayer insulating film 47. The interlayer insulating film may be deposited by CVD.

As illustrated in FIG. 3H, conductive plugs 48 are formed in the interlayer insulating film 47. The conductive plugs 48 reach to the upper surfaces of the wirings 46 from the upper surface of the interlayer insulating film 47. For example, a single damascene method is used for forming the conductive plugs 48.

Another interlayer insulating film 50 is formed on the interlayer insulating film 47. For example, silicon oxide is used for the interlayer insulating film 50, and the interlayer insulating film 50 is formed by CVD or the like. Wirings 51 are formed in the interlayer insulating film 50. For example, a single damascene method is applied for forming the wirings 51. The wirings 51 are connected to the underlying conductive plugs 48.

As illustrated in FIG. 3I, another interlayer insulating film 55 is formed on the interlayer insulating film 50. For example, silicon oxide is used for the interlayer insulating film 55, and CVD or the like is applied for forming the interlayer insulating film 55. Via holes 56 are formed in the interlayer insulating film 55. The wirings 51 are exposed on the bottoms of the via holes 56.

As illustrated in FIG. 3J, pads 58 are formed on the interlayer insulating film 55. The pads 58 are connected to the underlying wirings 51 passing through the via holes 56. The pads 58 are formed by forming a barrier metal film, plating copper, and patterning them.

As illustrated in FIG. 3K, the lamination structure from the support substrate 30 to the uppermost interlayer insulating film 55 is divided to obtain multi-chip modules including the semiconductor chips 20A and 20B.

In the state illustrated in FIG. 3C, a warp may be generated to the support substrate 30 because of a difference of thermal expansion coefficients between the resin filler material 36 and the support substrate 30. In order to suppress this warp, it is preferable to lower a height from the lower surface 32 to the upper surface of the insulating films 15A, 15B and thicken a region of the support substrate 30 defining the lower surface 31. For example, it is preferable that a thickness of the region of the support substrate 30 defining the lower surface 31 (thickness of a thin portion) is set equal to or more than twice as large as a height from the lower surface 32 to the upper surface of the insulating films 15A and 15B.

By thickening the portion of the support substrate 30 defining the lower surface 31, it becomes possible to maintain high a mechanical strength of each divided multi-chip module.

Second Embodiment

Next, description will be made on a semiconductor manufacture method according to the second embodiment with reference to FIGS. 4A to 4H.

Figure 4A:
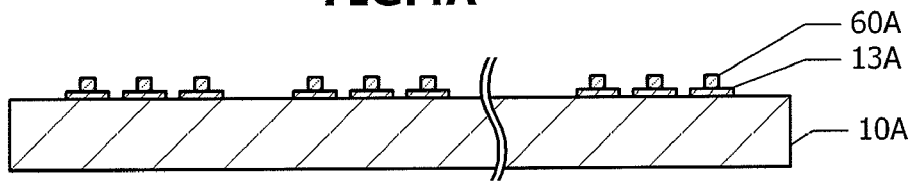
FIGS. 4A to 4C are cross sectional views illustrating a wafer during manufacture of the semiconductor device manufacture method according to the second embodiment.

As illustrated in FIG. 4A, conductive plugs 60A are formed on pads 13A formed on the surface of a wafer 10A. A height of each of the conductive plug 60A is, for example, 15 micrometers, and its diameter is, for example, 5 micrometers. For example, a semi-additive method is used for forming the conductive plugs 60A.

Figure 4B:
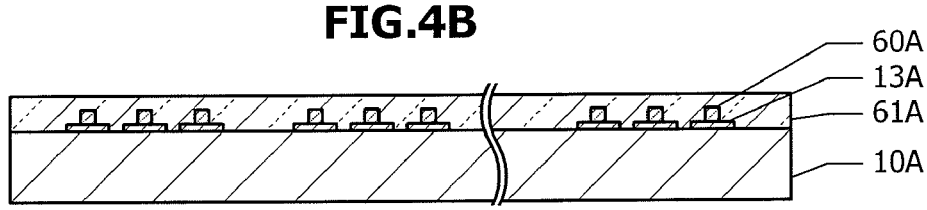

As illustrated in FIG. 4B, an insulating film 61A is formed on the wafer 10A to cover the conductive plugs 61A. For example, an insulating material such as silicon oxide, silicon nitride or the like is used for the insulating film 61A. A thickness of the insulating film 61A is, for example, 20 micrometers. The insulating film 61A is formed, for example, by CVD.

Figure 4C:
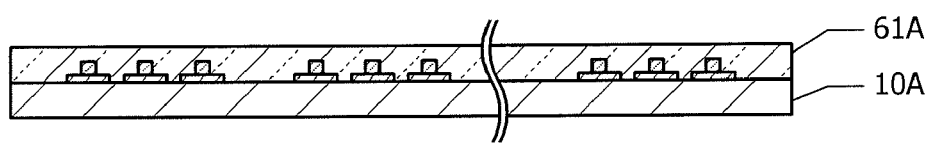

As illustrated in FIG. 4C, the bottom surface of the wafer 10A is ground to thin the wafer 10A to about 250 micrometers.

Figure 4D:
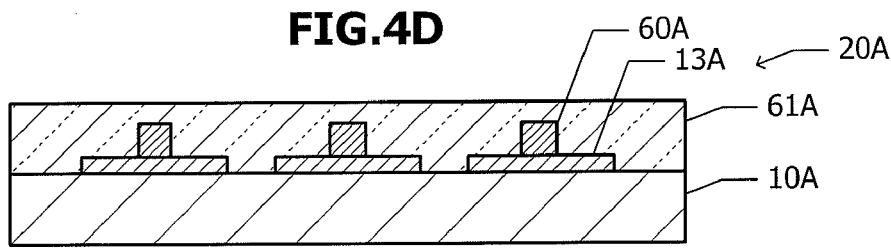
FIGS. 4D and 4E are cross sectional views illustrating a semiconductor chip after dividing the wafer.

As illustrated in FIG. 4D, the wafer 10A is divided into chips. Each of the divided semiconductor chips 20A includes a divided wafer (substrate) 10A, pads 13A, conductive plugs 60A and the insulating film 61A.

Figure 4E:
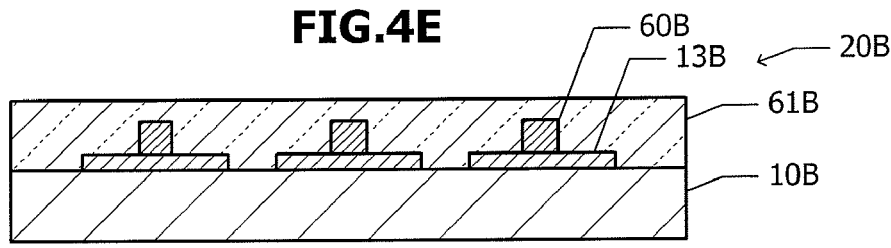

As illustrated in FIG. 4E, another semiconductor chip 20B is prepared which is divided from another wafer and formed with a different circuit. The semiconductor chip 20B includes a substrate 10B, pads 13B, conductive plugs 60B and an insulating film 61B.

By controlling a thickness of a wafer when the wafer illustrated in FIG. 4C is ground at a high work accuracy, it is possible to set thicknesses of a plurality of semiconductor chips 20A and 20B in a range of 250 micrometers±1 micrometer.

As illustrated in FIG. 4F, semiconductor chips 20A and 20B are mounted on the lower surface 32 of the support substrate 30. The support substrate 30 is the same as that used in the first embodiment method illustrated in FIG. 2D. Grinding is stopped when the support substrate 30 is ground equal to or thicker than 10 micrometers from the higher surface 33 of the support substrate 30. If the support substrate 30 is ground by 100 micrometers, a high work accuracy after grinding is easily attained. A height difference between the lower surface 32 and the higher surface 33 is set in such a manner that the higher surface 33 of the support substrate 30 is higher than the bottom surfaces of the conductive plugs 60A and 60B.

As illustrated in FIG. 4G, a filler material 36 is deposited on the support substrate 30. In depositing the filler material 36, the same method as the first embodiment method used for depositing the filler material 36 is applied. The semiconductor chips 20A and 20B are covered with the filler material 36. With the same method as illustrated in FIG. 3C, grinding is performed. The higher surface 33 of the support substrate 30 is exposed, and then the support substrate 30 is ground by equal to or more than 10 micrometers and then grinding is stopped. If the ground thickness is equal to or more than 100 micrometers, a working accuracy after grinding is easily attained. The upper regions of the filler material 36, insulating films 61A and 61B and the upper regions of the conductive plugs 60A and 60B are ground.

FIG. 4H is a cross sectional view after grinding. The upper surfaces of the insulating films 61A and 61B, the upper surfaces of the conductive plugs 60A and 60B and the upper surface of the filler material 36 have almost the same level as the higher surface 33. This structure is almost the same as that illustrated in FIG. 3E of the first embodiment. For example, if thicknesses of the conductive plugs 60A and 60B before grinding is set to 15 micrometers, a margin for locating the level of the upper surface after grinding between the levels of the upper and bottom surfaces of the conductive plugs 60A and 60B before grinding is ±7.5 micrometers. A variation in thicknesses of the semiconductor chips 20A and 20B is within a range of ±1.5 micrometers. A variation in thicknesses of the adhesive layer for bonding the semiconductor chips 20A and 20B is within a range of ±2 micrometers. It is possible to set an error between a target grinding thickness and an actually ground thickness equal to or less than ±1 micrometer. It is possible to set a variation in height with respect to in-plane direction after grinding equal to or less than ±1 micrometer. It is possible to set a variation in in-plane heights after polishing to ±1 micrometer or less. With these conditions, it has been confirmed from the above review that it is sufficiently possible to locate the level of the surface after grinding between the levels of the upper surface and bottom surface of the conductive plugs 60A and 60B before grinding. The processes after grinding are common to those illustrated in FIGS. 3F to 3K of the first embodiment.

Even with the second embodiment method, the same effects as those of the first embodiment method are able to be obtained. While the resin of the filler material 36 illustrated in FIG. 4G is cured, the conductive plugs 60A and 60B are covered with the insulating films 61A and 61B. It has been found that if resin is in direct contact with copper, the copper is likely to be oxidized during curing. As the conductive plugs 60A and 60B are covered with the insulating films 61A and 61B, it is possible to prevent the conductive plugs 60A and 60B from being oxidized.

Third Embodiment

Description will be made on the semiconductor device manufacture method according to the third embodiment with reference to FIGS. 5A to 5D.

FIG. 5A is a cross sectional view illustrating semiconductor chips 20A and 20B used in the third embodiment. Different points from the semiconductor chips 20A and 20B used in the second embodiment and illustrated in FIGS. 4D and 4E will be described below. Conductive plugs 60A and 60B formed in the semiconductor chips 20A and 20B of the third embodiment are thicker (larger in diameter) than the conductive plugs 60A and 60B illustrated in FIGS. 4D and 4E. For example, an area of a horizontal cross section of the conductive plugs 60A and 60B of the semiconductor chips 20A and 20B used in the third embodiment is generally the same as an area of the pads 13A and 13B. An area of a horizontal cross section of the conductive plugs 60A and 60B may be made larger than an area of the pads 13A and 13B. The other structures are the same as those illustrated in FIG. 4D. It is preferable that the conductive plugs 60A and 60B are made thicker (larger in diameter) under the condition that the pads 13A and 13B are not in contact with the pads 13A and 13B corresponding to the adjacent conductive plugs.

As illustrated in FIG. 5B, the semiconductor chips 20A and 20B are mounted on the lower surface 32 of the support substrate 30. The processes to the state illustrated in FIG. 5B are the same as the processes illustrated in FIGS. 4E to 4G of the second embodiment. The thick (large diameter) plugs 60A and 60B are exposed on the planarized surface. Since an area ratio of the conductive area on the planarized surface to a whole area of the planarized surface is large, it is difficult to form wirings on this surface.

As illustrated in FIG. 5C, an interlayer insulating film 65 is formed on the planarized surface. Inorganic insulating material such as silicon oxide, silicon nitride or the like, or insulating resin is used for the interlayer insulating film 65.

Conductive plugs 66 are formed through the interlayer insulating film 65. The conductive plugs 66 are connected to the underlying conductive plugs 60*a*, 60B. The conductive plugs 66 are thinner (smaller in diameter) than the conductive plugs 60A and 60B located under the conductive plugs 66.

The conductive plugs 66 may be formed, for example, a single damascene method. A ratio of the conductive area to the whole area of the planarized surface of the interlayer insulating film 65 is therefore smaller than a ratio of the conductive area in the planarized surface to the whole area of the planarized surface illustrated in FIG. 5B.

As illustrated in FIG. 5D, wirings 68 are formed on the interlayer insulating film 65. The semiconductor chips 20A and 20B are connected with the wirings 68. The wirings 68 may be formed, for example, by a semi-additive method. The following processes are the same as those illustrated in FIGS. 3G to 3K of the first embodiment.

It has been found that if an interlayer connection structure that copper conductive plugs are embedded in via holes formed in the epoxy resin insulating film is left in a high temperature atmosphere for a long time, an electric resistance of the conductive plugs increases. This is caused by that a portion of the conductive plug being in contact with the epoxy resin is transubstantiated. A plurality of samples was formed to evaluate a rise degree of an electric resistance of the conductive plugs. The evaluation results will be described below.

A height (thickness) of the conductive plugs were set to 15 micrometers. Diameters of the conductive plugs are set to 5 micrometers, 10 micrometers, 15 micrometers, 20 micrometers and 40 micrometers. These samples were left in an atmosphere at 130° C. for 100 hours, and rise rates of an electric resistance were measured. The measured results are given in Table 1.

TABLE 1

| Diameter of conductive plug | Rise ratio of electric resistance |
| --- | --- |
| 5 micrometers | 20% |
| 10 micrometers | 10% |
| 15 micrometers | 6.7% |
| 20 micrometers | 5% |
| 40 micrometers | 2.5% |

It is understood that as the conductive plug is made thick (large in diameter), a rise ratio of an electric resistance is suppressed. This is caused by that a thick (large diameter) conductive plug has a low ratio of a transubstantiated portion close to an interface between epoxy resin and copper in a horizontal cross section of the conductive plug.

In the third embodiment, insulating resin such as epoxy resin may be used for the first insulating film 61A and 61B.

Evaluation was made for an electric resistance rise ratio of plugs having a two-step structure including a relatively thin (small in diameter, small in horizontal cross-sectional area) upper conductive plug and a relatively thick (large in diameter, large in horizontal cross-sectional area) lower conductive plug under the upper conductive plug. The measured results are given in Table 2.

TABLE 2

| Diameter of lower plug | Diameter of upper plug | Rise ratio of electric resistance |
| --- | --- | --- |
| 40 micrometers | 5 micrometers | 4% |
| 40 micrometers | 10 micrometers | 4% |
| 40 micrometers | 15 micrometers | 3.5% |
| 40 micrometers | 20 micrometers | 3.5% |
| 40 micrometers | 40 micrometers | 3.0% |
| 20 micrometers | 5 micrometers | 4.5% |
| 20 micrometers | 10 micrometers | 4.5% |
| 20 micrometers | 15 micrometers | 5% |

TABLE 2-continued

| Diameter of lower plug | Diameter of upper plug | Rise ratio of electric resistance |
| --- | --- | --- |
| 20 micrometers | 20 micrometers | 5.5% |
| 20 micrometers | 40 micrometers | 5% |

The lower plug has a height of 15 micrometers, and the upper plug has a height of 0.3 micrometers. An electric resistance rise ratio is able to be suppressed equal to or lower than 4.5% even if a diameter of the upper plug is made small to 5 micrometers, if a lower plug diameter is equal to or larger than 20 micrometers. Since the upper plug is low, an electric resistance rise amount to be caused by copper oxidation is small. An electric resistance rise ratio of a plug having a two-step structure is therefore suppressed.

In the third embodiment, a relatively thin (small in diameter, small in horizontal cross-sectional area) upper conductive plug 66 is able to be made low (short, small in height). It is therefore possible to use insulating resin such as epoxy resin for the interlayer insulating film 65.

In the third embodiment, since the conductive plugs 60A and 60B are thick (large in diameter, large in horizontal cross-sectional area), a rise in an electric resistance is small even if the conductive plugs 60A and 60B are made high (tall, large in height). As compared to the second embodiment, it is therefore possible to make the conductive plugs 60A and 60B higher (taller, larger in height). As the conductive plugs 60A and 60B are made higher, a grinding margin in the height direction for grinding the higher surface 33 of the support substrate 30 and conductive plugs 60A and 60B illustrated in FIG. 5B becomes large. The interlayer insulating film 65 is disposed in order to provide electrical insulation between the underlying plugs 60A, 60B and wirings 68 on the interlayer insulating film 65. The thickness of the interlayer insulating film 65 is independent from the grinding margin. Therefore, the thin (small in diameter, small in horizontal cross-sectional area) conductive plug 66 is able to be made lower (smaller in height) than the thick (large in diameter, large in horizontal cross-sectional area) conductive plugs 60A and 60B.

In the third embodiment, since the conductive plugs 60A and 60B are made thick (large in diameter, large in horizontal cross-sectional area), the mechanical strength of the conductive plugs 60A and 60B is strong. The conductive plugs 60A and 60B therefore have resistance to damage during planarization grinding. For example, if the diameter of the conductive plugs 60A and 60B are set to 20 micrometers, damages hardly occurred during grinding even if a height of the conductive plugs 60A and 60B are set to 60 micrometers.

Fourth Embodiment

Description will be made on the semiconductor device manufacture method according to the fourth embodiment with reference to FIGS. 6A to 6C.

Figure 6A:
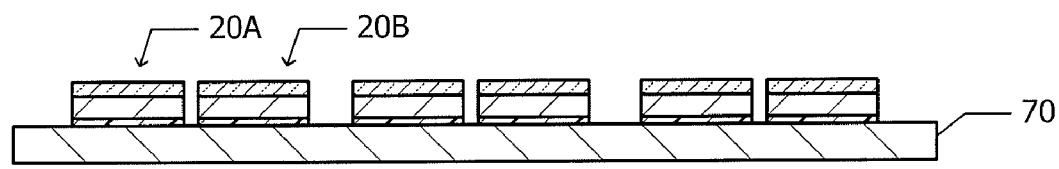
FIGS. 6A and 6B are cross sectional views illustrating a semiconductor device during manufacture of the semiconductor device manufacture method according to the fourth embodiment.

As illustrated in FIG. 6A, semiconductor chips 20A and 20B are mounted on a support substrate 70 having a flat upper surface. The semiconductor chips 20A and 20B are the same as the semiconductor chips 20A and 20B used in the first embodiment illustrated in FIGS. 1E and 1F. The semiconductor chips 20A and 20B may have the same structure as that of the semiconductor chips 20A and 20B illustrated in FIGS. 4D and 4E or as that of the semiconductor chips 20A and 20B illustrated in FIG. 5A. The semiconductor chips 20A and 20B are fixed to the support substrate 70 with adhesive. A silicon wafer, a glass substrate or the like are used as the support substrate 70, and its planar shape is, for example, circular.

Figure 6B:
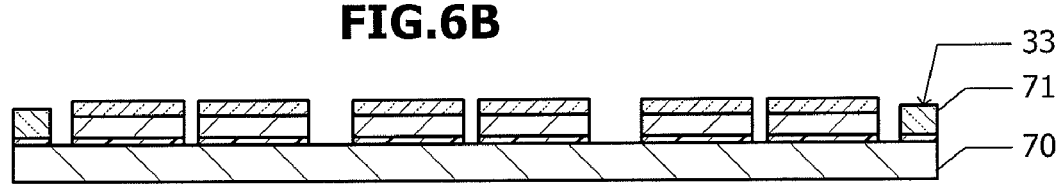
Figure 6C:
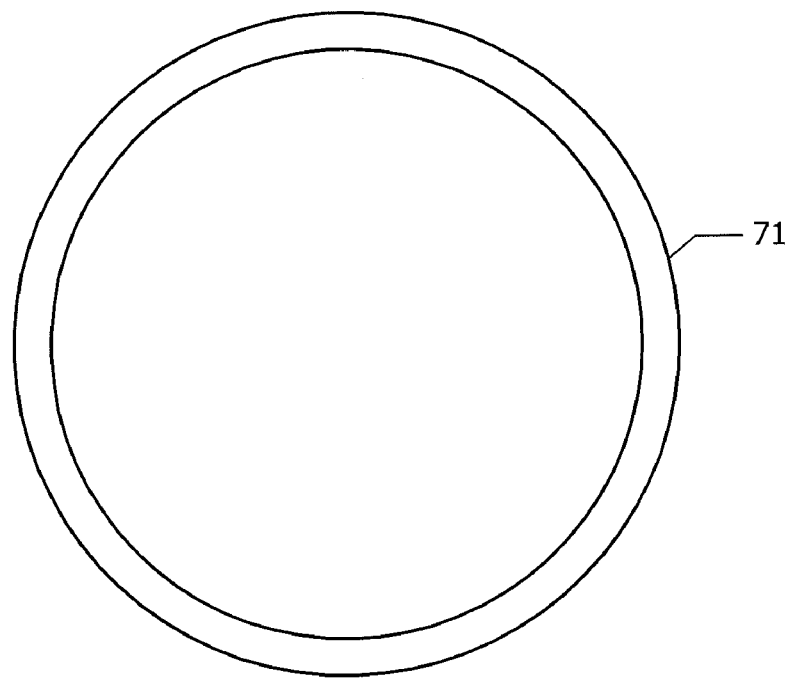
FIG. 6C is a plane view illustrating a frame member.

As illustrated in FIG. 6B, a frame member 71 is bonded to the support substrate 70 with adhesive. As illustrated in FIG. 6C, the frame member 71 has a ring planar shape along an outer circumference of the support substrate 70. The frame member 71 is made of material such as glass and ceramics harder than the filler material 36 illustrated in FIG. 3B. The top surface 33 of the frame member 71 has the same function as that of the higher surface 33 of the support substrate 30 of the first embodiment illustrated in FIG. 2D. Processes after the structure illustrated in FIG. 6B are the same as the processes of the first embodiment illustrated in FIGS. 3B to 3K.

In the fourth embodiment, instead of forming the recess 31 of the first embodiment illustrated in FIGS. 2C and 2D, the frame member 70 is bonded. The method of using the frame member 71 in the fourth embodiment is compared to the method of forming a recess by grinding or the like. The former method has an advantage in terms of no a variation in thicknesses generated when the recess is formed by grinding. The latter method is able to suppress an increase in a component cost for the frame member because the frame member is not required.

Fifth Embodiment

Description will be made on the semiconductor device manufacture method according to the fifth embodiment with reference to FIGS. 7A to 7C.

Figure 7A:
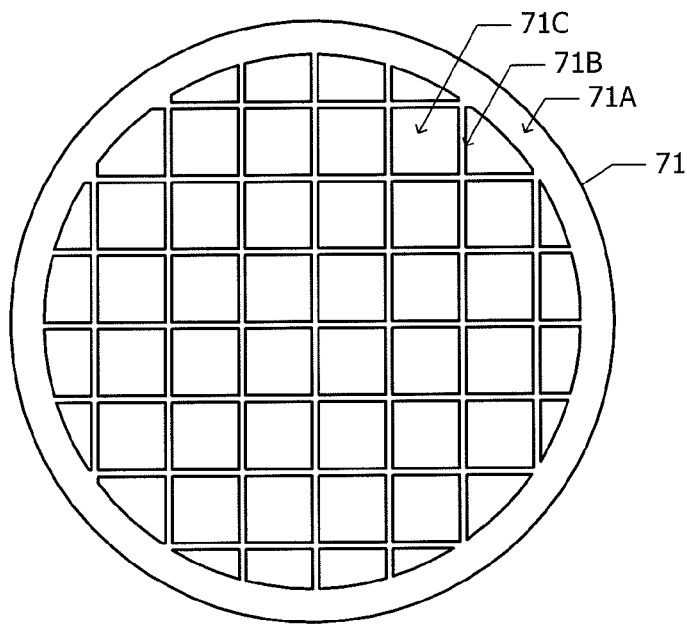
FIG. 7A is a plane view illustrating a frame member used in a semiconductor device manufacture method according to the fifth embodiment.

FIG. 7A is a plane view illustrating a frame member 71 used in the fifth embodiment. In the fourth embodiment, the ring frame member 71 is used. In the fifth embodiment, the frame member 71 includes a ring portion 71A and a lattice portion 71B formed inside the ring portion 71A. The lattice portion 71B defines opening portions 71C of a square shape arranged in a matrix in a plane.

Figure 7B:
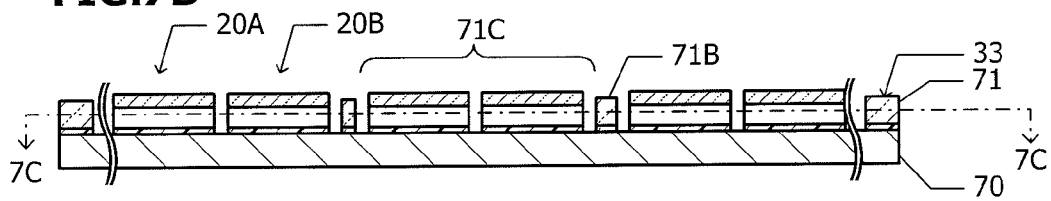
FIG. 7B is a cross sectional view of the semiconductor device during manufacture.
Figure 7C:
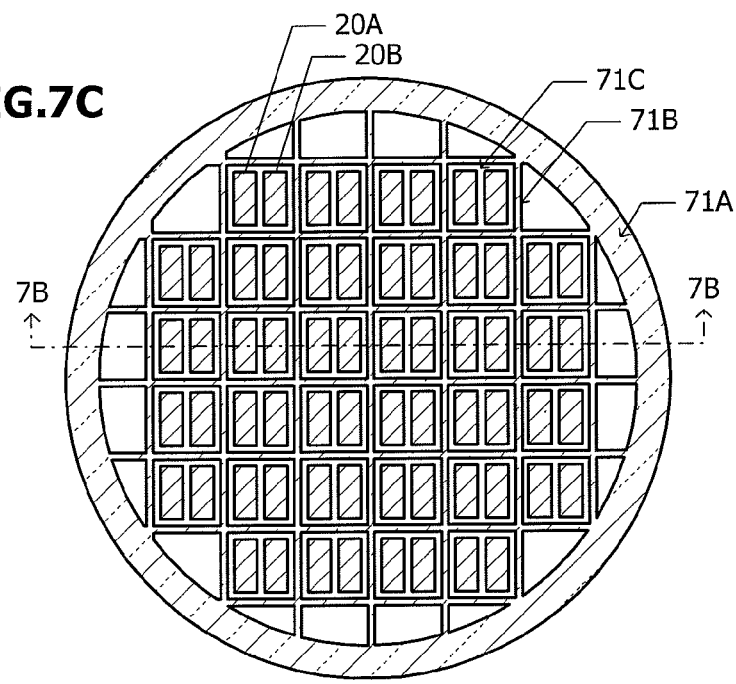
FIG. 7C is a plane cross sectional view taken along one-dot chain line 7C-7C in FIG. 7B.

FIG. 7B is a cross sectional view illustrating the state that the frame member 71 and the semiconductor chips 20A and 20B are bonded to a support substrate 70. FIG. 7C is a horizontal cross sectional view taken along one-dot chain line 7C-7C in FIG. 7B. A cross sectional view taken along one-dot chain line 7C-7C in FIG. 7B corresponds to FIG. 7B.

A pair of semiconductor chips 20A and 20B is disposed in one opening 71C. The top surface 33 of the frame member 71 has the same function as that of the higher surface 33 of the support substrate 30 of the first embodiment illustrated in FIG. 2D. Processes after the structure illustrated in FIG. 6B is formed are the same as processes of the first embodiment illustrated in FIGS. 3B to 3K.

Figure 7D:
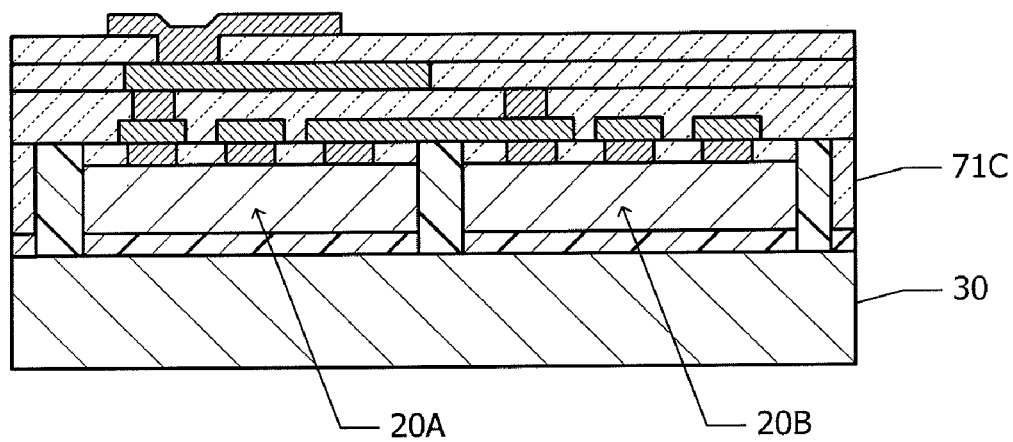
FIG. 7D is a cross sectional view illustrating a multi-chip module manufactured by the semiconductor manufacture method according to the fifth embodiment.

FIG. 7D is a cross sectional view illustrating a multi-chip module after division. The support substrate 70 and the frame member 71 are divided along center lines of the lattice portion 71B. In the first embodiment, the filler material 36 are exposed on end facets of the multi-chip module as illustrated in FIG. 3K. In the fifth embodiment, the lattice portions 71B of the frame member 71 are exposed on end facets, and the filler material 36 is not exposed.

In the fifth embodiment, since the frame member 71 has the lattice portion 71B, the amount of the filler material 36 is less than that of the first embodiment. Since the amount of resin to be used is less, it is possible to suppress warp of the substrate to be caused by a difference of thermal expansion coefficients of the resin and the support substrate.

Also in the fifth embodiment, dicing is performed not along the filler material 36 of resin of the first embodiment illustrated in FIG. 3J but along the lattice portions 71B of glass or the like. It is therefore possible to reduce occurrence of defective modules during dicing.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention have been described in detail, it should be understood that the various changes, substitutions, and alterations could be made hereto without departing from the spirit and scope of the invention.

What is claimed is:

1. A method for manufacturing a semiconductor device comprising:

mounting chips over a first surface of a support substrate, each of the chips including pads and a first insulating film covering the pads, the support substrate having a second surface that is located on a same side of the first surface and above a level of the first surface, a first height from the first surface to the second surface being higher than second heights from the first surface to bottom surfaces of the first insulating films and being lower than third heights from the first surface to upper surfaces of the first insulating films in a state that the chips are fixed to the first surface of the support substrate;

filling a filler material in a space between the chips and covering the chips and the second surface with the filler material;

grinding the filler material and the first insulating films to a point at which (a) the second surface is exposed, (b) ground surfaces of the first insulating films are, after grinding, located between the bottom surfaces of the first insulating films and the upper surfaces of the first insulating films before grinding, and (c) the ground surfaces of the first insulating films are, after grinding, located at a same level as an upper surface of the filler material after grinding and the second surface of the support substrate; and after the filler material and the first insulating films are ground, forming wirings over the filler material and the first insulating film, the wirings connecting a pad of one of the chips to a pad of another chip.

2. The method for manufacturing the semiconductor device according to claim 1, wherein:

first conductive plugs connected to the pads are formed in the first insulating film of each of the chips; and in grinding the filler material, the filler material is ground until the first conductive plugs are exposed.

3. The method for manufacturing the semiconductor device according to claim 2, further comprising steps, after the step of grinding the filler material and before the step of forming the wirings, of:

forming a second insulating film over the first insulating film of each of the chips, the filler material and the second surface; and forming second conductive plugs in the second insulating film, the second conductive plugs being connected to the first conductive plugs and being smaller in horizontal cross-sectional area than the first conductive plugs;

wherein the wirings are formed over the second insulating film and connected to the first conductive plugs via the second conductive plugs.

4. A method for manufacturing a semiconductor device including chips, the method comprising:

before the chips are mounted, preparing a support substrate by grinding a substrate from one surface to form a recess having a first surface as a bottom surface of the recess, whereby the support substrate has a second surface that is located on a same side of the first surface and above a level of the first surface;

mounting chips over the first surface of the support substrate, each of the chips having including pads and a first insulating film covering the pads;

filling a filler material in a space between the chips and covering the chips and the second surface with the filler material;

grinding the filler material until the second surface and the first insulating film are exposed; and after the filler material is ground, forming wirings over the filler material and the first insulating film, the wirings connecting a pad of one of the chips to a pad of another chip.

5. The method for manufacturing the semiconductor device according to claim 1, further comprising:

before the chips are mounted, preparing the support substrate by fixing a frame member having a constant height to a part of the area of the first surface of a substrate having the first surface exposed, the second surface then being defined by an upper surface of the frame member.

6. The method for manufacturing the semiconductor device according to claim 5, wherein:

the frame member has an overall planar shape and comprises an outer frame and a portion and a lattice portion formed inside the outer frame portion, the lattice portion including openings through a thickness of the frame member;

the chips are mounted inside respective ones of the openings; and each of the openings is surrounded by lattice lines of the lattice portion.

7. The method for manufacturing the semiconductor device according to claim 1, wherein:

a material constituting the second surface is harder than the filler material.

8. The method for manufacturing the semiconductor device according to claim 1, comprising, before carrying out the other steps:

providing the first surface and the second surface by providing a substrate blank having a flat upper surface, and grinding a recess into the flat upper surface by removing substrate material, such that the recess has a flat bottom surface;

wherein the flat bottom surface comprises the first surface and an unground portion of the flat upper surface comprises the second surface.

9. The method for manufacturing the semiconductor device according to claim 1, further comprising:

before the chips are mounted, grinding a substrate from one surface to form a recess having the first surface as a bottom surface to prepare the support substrate.

* * * * *